United States Patent
Lane et al.

(10) Patent No.: US 8,487,260 B2
(45) Date of Patent: Jul. 16, 2013

(54) SENSOR

(75) Inventors: William A. Lane, Waterfall (IE); Eamon Hynes, Raheen (IE); Edward John Coyne, Galway (IE)

(73) Assignee: Analog Devices, Inc., Norwood, MA (US)

( * ) Notice: Subject to any disclaimer, the term of this patent is extended or adjusted under 35 U.S.C. 154(b) by 974 days.

(21) Appl. No.: 11/584,725

(22) Filed: Oct. 20, 2006

(65) Prior Publication Data

US 2007/0138395 A1   Jun. 21, 2007

Related U.S. Application Data

(63) Continuation-in-part of application No. 11/045,910, filed on Jan. 26, 2005, and a continuation of application No. PCT/EP2006/050174, filed on Jan. 12, 2006.

(51) Int. Cl.
    *G01J 5/02* (2006.01)
(52) U.S. Cl.
    USPC .................. 250/339.01; 250/339.02; 250/349
(58) Field of Classification Search
    USPC ............... 250/338.1, 338.4, 339–339.03, 353
    See application file for complete search history.

(56) References Cited

U.S. PATENT DOCUMENTS

| | | | |
|---|---|---|---|
| 4,286,225 A | 8/1981 | Morong, III | |
| 4,360,784 A | 11/1982 | Bartlett | |
| 4,682,030 A | 7/1987 | Rose et al. | |
| 4,994,664 A | 2/1991 | Veldkamp | |
| 5,034,608 A | 7/1991 | Tavrow et al. | |
| 5,210,400 A | 5/1993 | Usami | |
| 5,528,038 A | 6/1996 | Yoshiike et al. | |
| 5,550,373 A | 8/1996 | Cole et al. | |
| 5,567,942 A | 10/1996 | Lee et al. | |
| 5,650,624 A | 7/1997 | Wong | |
| 5,668,033 A | 9/1997 | Ohara et al. | |
| 5,701,008 A | 12/1997 | Ray et al. | |
| 5,721,430 A | 2/1998 | Wong | |
| 5,754,088 A | 5/1998 | Fletcher et al. | |
| 5,914,488 A | 6/1999 | Sone | |

(Continued)

FOREIGN PATENT DOCUMENTS

| | | |
|---|---|---|
| DE | 10 2004 031315 | 1/2006 |
| EP | 0646972 A2 | 4/1995 |

(Continued)

OTHER PUBLICATIONS

Mori, T. et al, "Vacuum-encapsulated thermistor bolometer type miniature infrared sensor", IEEE, Jan. 1994, pp. 257-262.

(Continued)

*Primary Examiner* — Casey Bryant
(74) *Attorney, Agent, or Firm* — Knobbe Martens Olson & Bear LLP

(57) ABSTRACT

The invention provides a sensor including a first sensor element formed in a first substrate and at least one optical element formed in a second substrate, the first and second substrates being configured relative to one another such that the second substrate forms a cap over the first sensor element, the at least one optical element being configured to guide incident radiation on the cap to the first sensor element. The sensor also includes a reference sensor element whose output can be used to reference the output of the first sensor element.

22 Claims, 13 Drawing Sheets

U.S. PATENT DOCUMENTS

| | | | |
|---|---|---|---|
| 5,962,854 A * | 10/1999 | Endo | 250/349 |
| 6,038,065 A | 3/2000 | Borden | |
| 6,048,092 A | 4/2000 | Kimura et al. | |
| 6,215,816 B1 | 4/2001 | Gillespie et al. | |
| 6,222,454 B1 | 4/2001 | Harling et al. | |
| 6,249,171 B1 | 6/2001 | Yaklin et al. | |
| 6,252,229 B1 | 6/2001 | Hays et al. | |
| 6,359,276 B1 | 3/2002 | Tu | |
| 6,392,232 B1 | 5/2002 | Gooch et al. | |
| 6,460,411 B1 * | 10/2002 | Kersjes et al. | 73/204.26 |
| 6,504,155 B1 | 1/2003 | Ookawa | |
| 6,965,107 B2 | 11/2005 | Komobuchi et al. | |
| 7,064,442 B1 | 6/2006 | Lane et al. | |
| 7,326,932 B2 | 2/2008 | Hynes et al. | |
| 7,435,964 B2 * | 10/2008 | Lane et al. | 250/338.1 |
| 7,692,148 B2 * | 4/2010 | Lane et al. | 250/338.1 |
| 2001/0035559 A1 | 11/2001 | Ando et al. | |
| 2002/0175284 A1 | 11/2002 | Vilain | |
| 2002/0191819 A1 | 12/2002 | Hashimoto et al. | |
| 2003/0075794 A1 | 4/2003 | Felton et al. | |
| 2003/0209893 A1 | 11/2003 | Breed et al. | |
| 2003/0213910 A1 | 11/2003 | Anderson et al. | |
| 2004/0173751 A1 * | 9/2004 | Komobuchi et al. | 250/338.1 |
| 2005/0218327 A1 | 10/2005 | Uchida et al. | |
| 2006/0060788 A1 * | 3/2006 | Uchida et al. | 250/343 |
| 2006/0091300 A1 | 5/2006 | Nishimura | |
| 2006/0163453 A1 | 7/2006 | Hynes et al. | |
| 2006/0226365 A1 * | 10/2006 | Fleury | 250/338.1 |
| 2007/0108388 A1 | 5/2007 | Lane et al. | |
| 2007/0120060 A1 | 5/2007 | Lane et al. | |
| 2007/0138394 A1 | 6/2007 | Lane et al. | |
| 2007/0138395 A1 | 6/2007 | Lane et al. | |
| 2008/0061237 A1 | 3/2008 | Franz et al. | |
| 2008/0164415 A1 | 7/2008 | Kierse et al. | |

FOREIGN PATENT DOCUMENTS

| | | |
|---|---|---|
| JP | 07092026 | 4/1995 |
| JP | 08145787 | 6/1996 |
| JP | 08261835 | 10/1996 |
| JP | 2000338389 | 12/2000 |
| WO | WO 00/03215 | 1/2000 |
| WO | WO 01/09579 | 2/2001 |
| WO | WO 2006/007958 | 8/2006 |

OTHER PUBLICATIONS

International Search Report, PCT/EP2006/050174, Apr. 13, 2006.

International Search Report and Written Opinion from corresponding International application No. PCT/EP2009/051506 mailed Jul. 6, 2009.

International Preliminary Report on Patentability dated Aug. 26, 2010 in International Application No. PCT/EP2009/051506.

PCT/EP2007/061091 international search report and written opinion, Jan. 4, 2008.

PCT/EP2007/061093, international search report and written opinion, Jan. 29, 2008.

PCT/EP2007/061099 international search report and written opinion, Feb. 12, 2008.

* cited by examiner

SENSOR

RELATED APPLICATIONS

This application is a continuation-in-part of co-pending U.S. patent application Ser. No. 11/045,910, filed Jan. 26, 2005 and titled "Sensor," and is a continuation of International Application PCT/EP/050174, filed Jan. 12, 2006, the latter claiming Paris Convention priority to said U.S. patent application Ser. No. 11/045,910, which applications are hereby incorporated by reference.

FIELD OF THE INVENTION

The present invention relates to sensors and in particular to a sensor formed from two substrates using semiconductor processing techniques. The invention more particularly relates to an arrangement wherein the two substrates are arranged relative to one another so as to provide at least two sensing elements in one substrate and a cap above each of the sensing element formed in a second substrate so as to form two cells. The first and second cells differ from one another in their response characteristics.

BACKGROUND

Sensors are well known in the art. When formed in a semiconductor material such as silicon or germanium such sensors may be provided as mechanical structures, for example as a MEMS arrangement, or electromagnetic (EM) radiation sensors such as infra-red (IR) sensors. By using materials such as silicon it is possible to form the sensor in one or more layers of the wafer from etching and other semiconductor processing techniques so as to result in a desired configuration. Due to the delicate nature of the sensors and their sensitivity to the surrounding environment it is known to provide a protective cap over the sensor, the cap serving to isolate the environment of the sensor from the ambient environment where the sensor is operable. Within the area of EM sensors there is a specific need for sensors that can be provided in a packaged form.

SUMMARY

These and other problems are addressed in accordance with the teaching of the present invention by a sensor formed from two substrates using semiconductor processing techniques. The two substrates are arranged relative to one another so as to provide at least two sensing elements in one substrate and a cap above each of the sensing element formed in a second substrate so as to form two cells. The first and second cells differ from one another in their response characteristics.

By providing two co-located cells whose response characteristics differ it is possible to reference the output of a first cell using that of a second cell.

Accordingly, a first embodiment provides an electromagnetic sensor having first and second sensor elements formed in a first substrate, and a first and second cap formed in a second substrate. The first and second substrates can be arranged relative to one another such that each of the first and second sensor elements has a respective cap provided thereabove thereby providing first and second cells. The first cell can provide an output based on a first response characteristic, and the second cell can provide an output based on a second response characteristic. Advantageous embodiments are provided in dependent claims thereto, and in the other independent claims of the application as filed.

BRIEF DESCRIPTION OF THE DRAWINGS

The present invention will now be described with reference to the accompanying drawings in which.

DETAILED DESCRIPTION OF THE DRAWINGS

The invention will now be described with reference to exemplary embodiments of FIGS. 1 to 17. Although the invention has application in any electromagnetic (EM) radiation sensing environment, for the ease of explanation it will now be described with reference to a preferred illustrative embodiment, that of a silicon wafer-based thermal radiation sensor. While it is possible for each of the embodiments illustrated hereinafter to be used in combination with one another it will be understood that the invention is not to be construed in this limiting fashion as features and components of one embodiment may or may not be used with those of another embodiment. In this way the invention is only to be limited insofar as deemed necessary in the light of the appended claims.

Electromagnetic radiation sensors often contain delicate sensing membranes. The fragile nature of the membrane necessitates careful (with resultant cost repercussions) handling of the sensor after the membrane has been manufactured to prevent damage and yield loss. In addition, for membrane-based thermal radiation sensors, it is an advantage to package the sensor in a vacuum or other low pressure environment to eliminate heat loss from the absorbing membrane through gas convection and conduction. Finally, while many single point IR sensors do not use a focusing lens at all, it is an advantage in single point thermal sensors to be able to focus the incoming radiation onto a single sensitive point on the membrane to effectively amplify the signal. In the cases where single point IR sensors are using a lens, they generally use a refractive lens of a material with a suitable shape and refractive index, for example germanium or other similar material.

For imaging a thermal scene onto a sensor array to produce an infrared picture of the scene, the same requirements also apply with the additional requirement that focusing the beam (i.e. with a lens) is highly desirable to produce a focused image of the scene on the image plane of a sensor array.

The sensor of the present invention addresses these and other challenges described above by providing a device and method for capping the thermal sensor at the wafer level with a silicon cap. In accordance with the present invention a sensor device (or array of repeating sensor devices) is manufactured on one wafer substrate and a capping wafer is manufactured on a separate substrate. The capping wafer is joined to the sensor wafer and bonded to it under controlled ambient conditions, the preferred embodiment being under vacuum conditions. This bonded wafer arrangement can be singulated or sawn into individual capped sensor chips for final packaging and sale. Such capping methodologies are well described in U.S. Application No. 20030075794 of Felton et al which is assigned to the Assignee of the present invention, and the contents of which are incorporated herein by reference.

Figure 1:
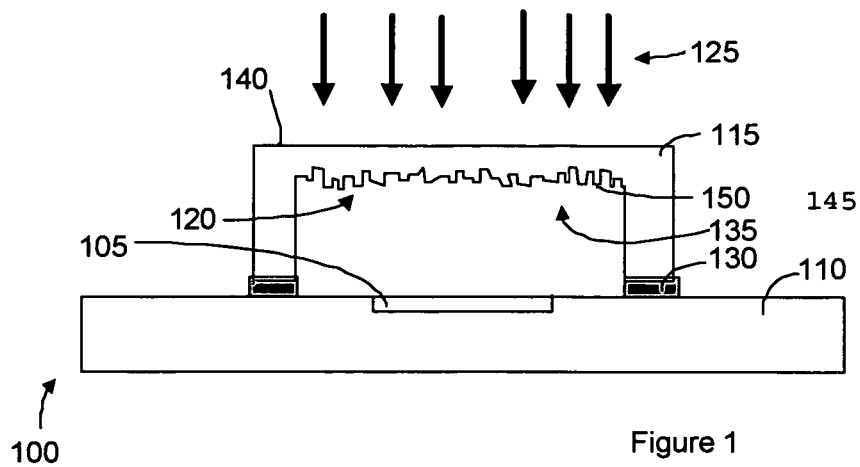
FIG. 1 is a cross section through an illustrative embodiment of a sensor for practicing the present invention.
Figure 2:
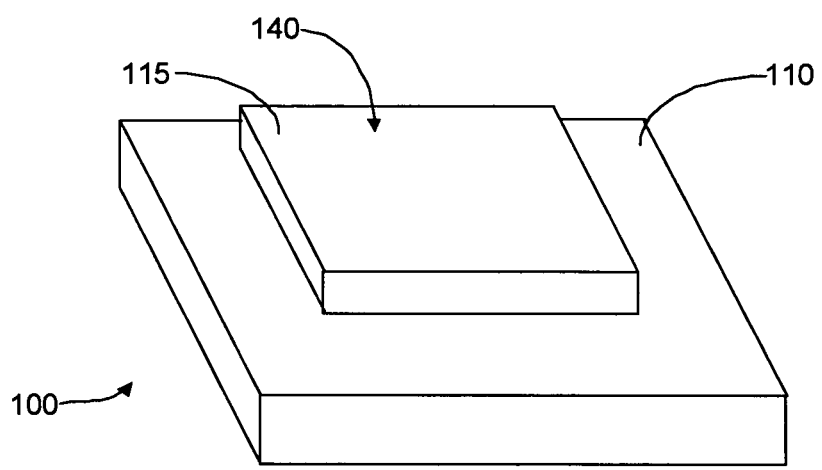
FIG. 2 is a perspective view from above of the sensor of FIG. 1.

FIG. 1 shows in cross section, such a sensor device 100. The device includes a sensing element 105 formed in a first silicon wafer 110 or what is sometimes called a sensor die. A cap 115 consisting of a silicon lid into which patterns 120 are etched to form an individual diffracting optical element is also provided. Two possible approaches to implementing this diffractive optical element (DOE) are known as amplitude modulation and phase modulation respectively. In the case of amplitude modulation, the surface pattern consists of areas that allow transmission of the radiation and areas that block the radiation. In the case of phase modulation the pattern consists of height variations on the surface that effectively modify the relative phase of the radiation as a function of the relative height differences of the pattern. In this illustrated embodiment the pattern is provided on an interior surface 135 of the cap, but it will be appreciated that it could also be provided on an exterior surface 140. It will also be appreciated that the pattern, whose geometry is exaggerated for ease of viewing, includes a plurality of ridges 150 whose distance apart and depth is related to the wavelength of light with which the optical element is being used. The cap is typically formed in a second silicon wafer or capping die. This pattern 120 defined in the diffracting optical element cap 115 is capable of focusing incident radiation 125 of a given frequency onto a specific plane of the sensor or onto a specific point on the sensor or of focusing different frequencies onto different points. The cap 115 is bonded to the first wafer using a bond or seal material 130 and the bonding defines a sealed cavity 145, which can be at a different pressure than ambient pressure, typically a lower pressure. Alternatively the sealed nature of this cavity and the manufacturing process allows the ambient gas within the cavity to be different to air, for example we could use Xenon which has a lower thermal conductivity than air or some other gas. Although a silicon cap is substantially opaque to incident light in the visible spectrum and therefore it may be considered that it occludes the light from impinging on the sensing element within, it will be appreciated that silicon allows a transmission of light in the infra-red frequencies of the EM spectrum and therefore for this application, the provision of an IR sensor, it is a suitable material. FIG. 2 shows an example of an assembled sensor device from which it will be seen that the sensing element is covered by the cap provided above it.

Figure 3:
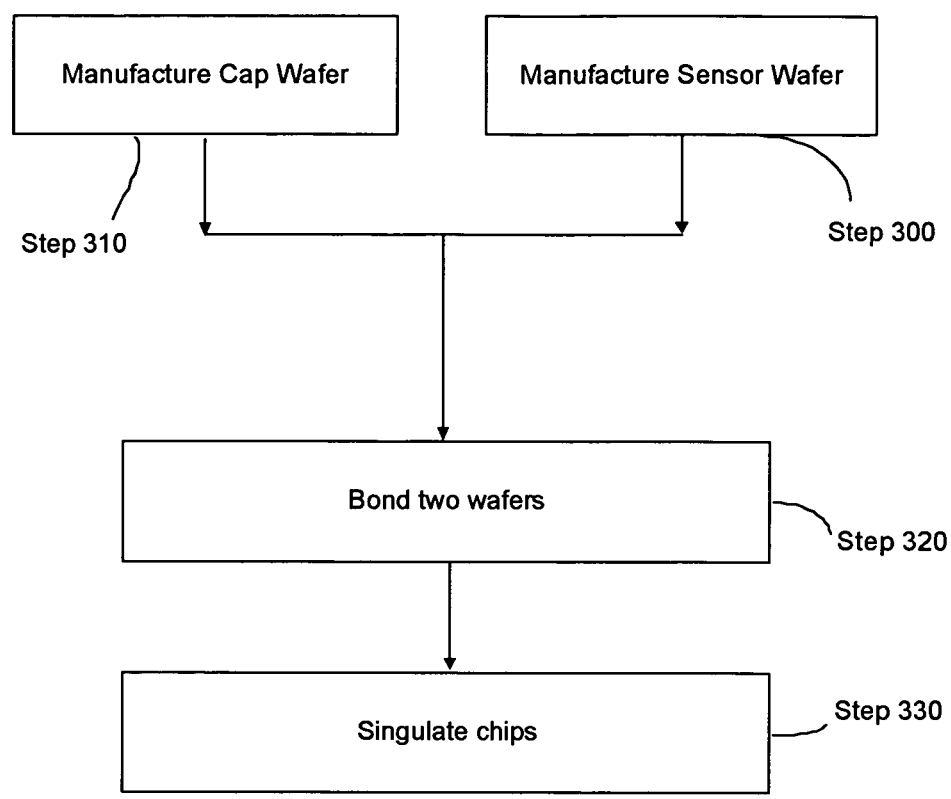
FIG. 3 is an example of a methodology that may be employed for forming the sensor of FIG. 1.

A typical process flow for manufacture of the sensor is shown in FIG. 3. Firstly, the sensor wafer 110 is manufactured using techniques that will be well known to those in the art (Step 300). The capping wafer is also manufactured (Step 310) separately. The manufacture of this capping wafer includes the etching of a desired pattern on either or both of the outer 140 or inner surface 135 of the cap. An anti-reflective coating may additionally be added to the cap surface, either inner or outer. Once the desired components on each of the two wafer substrates are provided, the wafers may be brought together so as to be bonded (Step 320). Ideally, this bonding is achieved under vacuum conditions. Once the two wafers have been brought together individual chips may be singulated or defined within the total area of the wafers by removing the areas of the second wafer that do not define the cap (Step 330). In this manner a plurality of individual chips or sensors may be provided in one process flow.

Figure 4A:
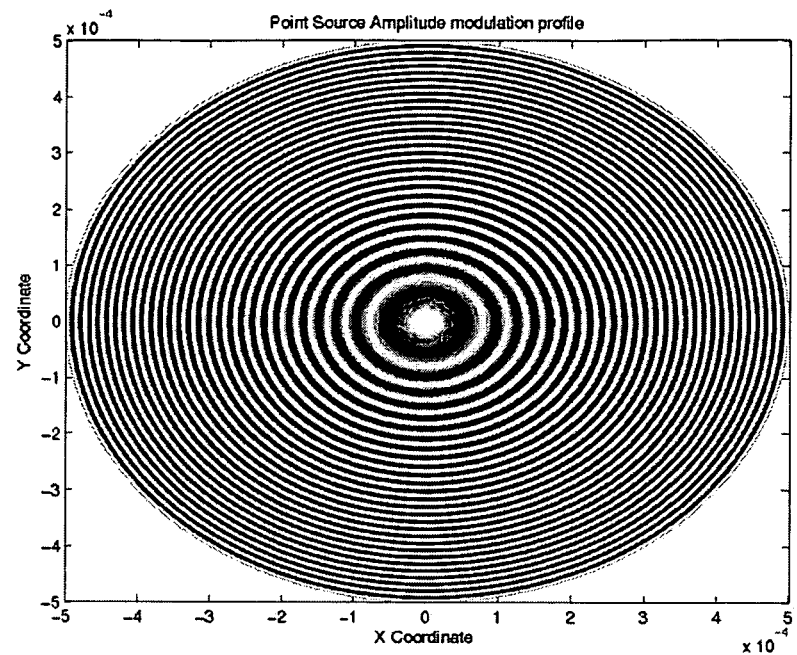
FIG. 4A is an example of a first pattern that may be used to define an optical element in accordance with the teachings of the present invention.
Figure 4B:
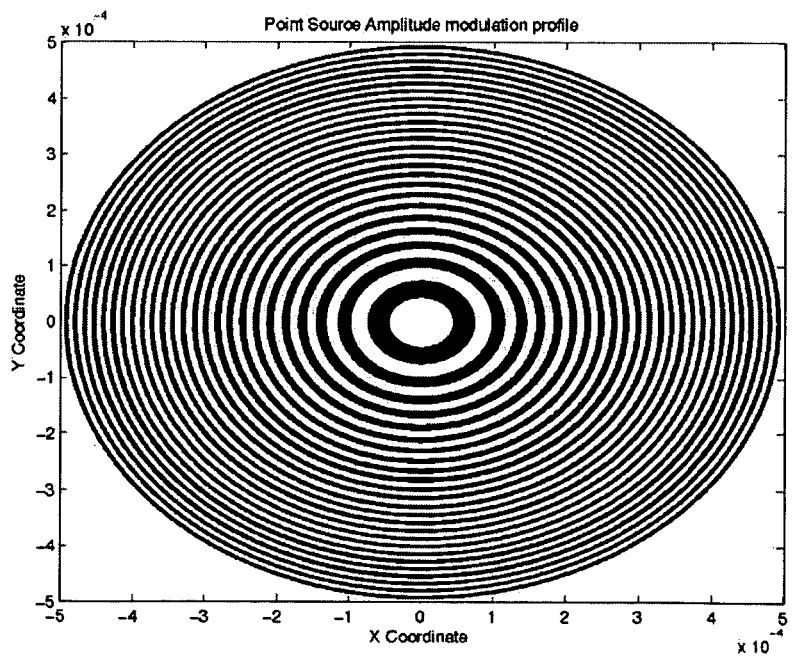
FIG. 4B is an example of a second pattern that may be used to define an optical element in accordance with the teachings of the present invention.
Figure 4C:
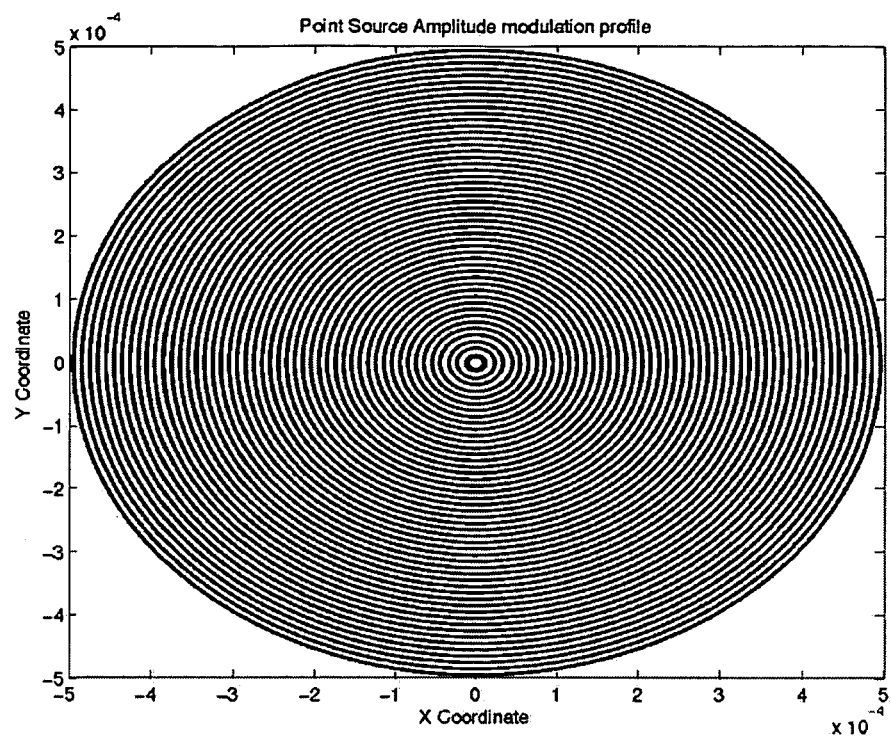
FIG. 4C is an example of a third pattern that may be used to define an optical element in accordance with the teachings of the present invention.

It will be understood that the nature of the pattern defining the optical element will effect how the sensor performs. FIG. 4 shows examples of pattern types, which can be implemented using either an amplitude modulation or a phase modulation approach, which may be used to define diffractive optics in the sensor cap. The example of FIG. 4A is optimised for a focusing of parallel input light of wavelength 10 micrometer down to a focal plane 300 micrometer away using a sinusoidal variation in the height of the diffractive optical element for a phase modulation approach. The relative heights of the sinusoid are represented by the gray scale variation in the pattern, for an amplitude modulation approach the gray scale would represent the transmission efficiency of the pattern. The example of FIG. 4B is designed for a focusing of parallel input light of wavelength 10 micrometer down to a focal plane 370 micrometer away but in this case the black and white pattern represents a single step height variation to implement the grating of the phase modulated diffractive optical element rather than a sinusoidal variation. The example in FIG. 4C also uses a single step height variation to implement the diffractive optical element but in this case it is designed to focus parallel input light of wavelength 10 µm down to a focal plane 10 micrometer away. It will be understood that these three examples are illustrative of the type of pattern that may be used and that different design requirements regarding the control of the focus plane or independent control over different wavelength components within the incident radiation are also possible with this approach and are covered by this invention. These examples, consisting of black and white circles in FIG. 4B and 4C can represent either a transmission pattern or a phase modulation pattern that focuses the light, but suffer in that losses in transmission are also achieved. It will be appreciated however that the design of the pattern may be optimised to achieve lower loss criteria such as for example introducing curved side walls in the ridge features defining the grating, as represented by the grayscale diagram of FIG. 4A.

The cap provided by the present invention is advantageous in a number of aspects. It serves to: 1) protect the membrane during subsequent handling, 2) it also provides a housing for the sensing membrane that can be evacuated during manufacture, and 3) it can be patterned and etched in such a way as to focus the incident infra red radiation onto a single point to amplify the signal or onto an array to create an image of a scene. In particular, the pattern can be such as to implement an optical element (i.e. conventional refractive or Fresnel lens) or in the preferred embodiment a diffractive optical element. The creation of an optical element for this application is advantageous in that the lens can be implemented in silicon rather than the more exotic (and expensive) materials required heretofore for an infrared refractive lens. The advantage resulting from the use of diffractive optics in the silicon cap is that the lenses can be patterned and etched at the wafer batch level using well established processes and bonded to the sensor wafers, resulting in a cost effective lens compared to the refractive lens technologies heretofore employed. This approach may be applicable to other electromagnetic radiation sensors in addition to the infrared application described here. For example the cap could be made of quartz or in some cases standard glasses such as pyrex or possibly sapphire if the sensor is to be used for applications other than IR sensors.

Figure 5:
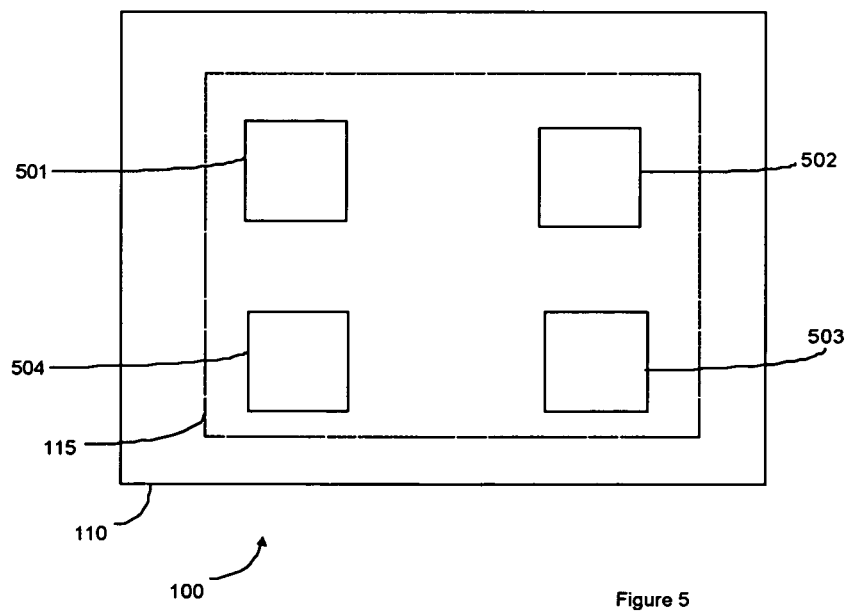
FIG. 5 is a plan schematic showing an example of a sensor including multiple sensor elements in accordance with an illustrative embodiment of the invention.

In some applications it may also be useful to be able to use the lens/cap configuration to focus different wavelengths within the incoming radiation onto different sensors enclosed by the cap. FIG. 5 is a schematic illustration of one such example where four sensing elements 501, 502, 503, 504 are provided within the same cap arrangement. It will be appreciated that suitable designing of the lens arrangement may allow for an optimisation of the sensor to focus one particular wavelength while defocusing (rejecting) others. This would allow individual intensity measurement of different wavelength components within the infrared radiation, a capability that could be very useful in for example gas analysis such as alcohol breath samplers where there is a desire to monitor the level of ethyl alcohol in the breath of a person. As alcohol has specific absorbance peaks in the IR spectrum, the focusing of radiation coincident with these peaks onto specific ones of the sensors elements 501, 502, 503, 504 provided in an array below the cap will enable the discrimination of any change in the intensity of the radiation at those specific frequencies therefore serve as an indicator of alcohol present in a sample. As each of the sensor elements are configured to react to incident radiation of a suitable frequency, when that radiation is incident on the individual sensors, an analysis of the performance of each of the sensor elements indicates the presence or absence of the material for which it is designed to react to—providing a gas wavelength signature of the gas being analysed.

Figure 6:
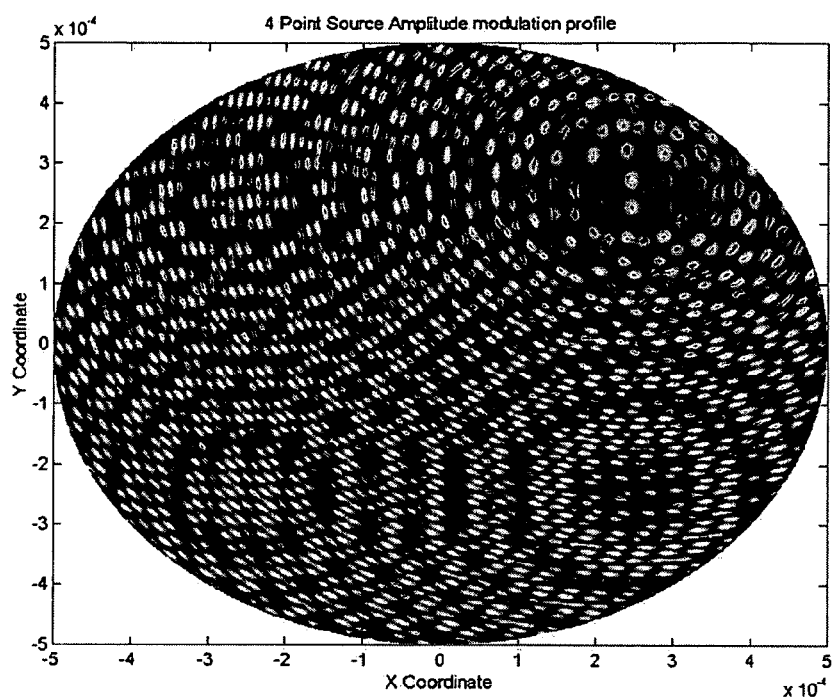
FIG. 6 is an example of a pattern that may be used to define an optical is element suitable for use with multiple sensor elements in FIG. 5 in accordance with the teachings of the present invention.

FIG. 6 is an example of a diffractive optical element (DOE) design using an amplitude modulation approach that could be used in combination with the sensor arrangement in FIG. 5 to focus each one of four distinct wavelengths within the incident radiation onto one of the four sensing elements 501, 502, 503, 504 that are shown in FIG. 5. Such a design or pattern could be fabricated by creating a single step in the lens or providing multiple steps of different heights. It will be appreciated that the invention is not intended to be limited in any way as to the fabrication of a DOE in that it is intended to encompass all methods of manufacture be they single step, multiple step or other variants.

Figure 7:
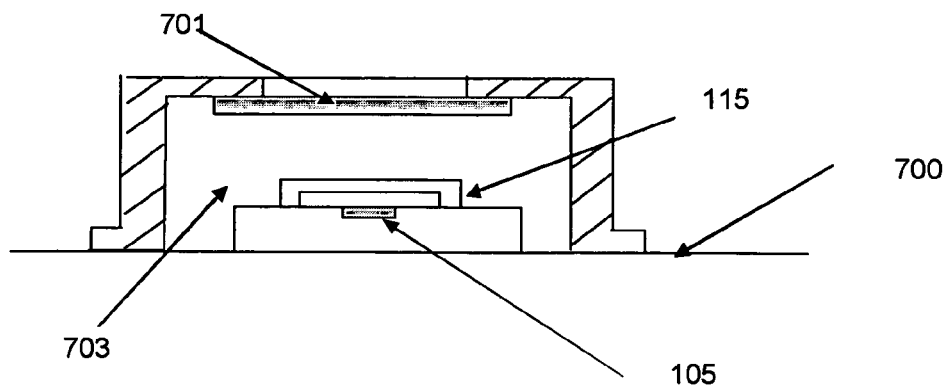
FIG. 7 is a sectional view of a compound sensor in accordance with the teachings of the invention.

Although not shown, it will be appreciated that the structure of the present invention may be further modified to include a second lens arrangement provided over the optical element so as to effect a compound lens effect. Such an arrangement may be suitable for applications such as increasing magnification, increasing the field of view, increased resolution and improved optical filtering. Such an arrangement could be provided by providing a second lens coupled to the chip. Alternatively, and as shown in FIG. 7, it is possible to s fabricate a second lens 701 and couple that second lens to the completed package 700. In this way a defined volume 703 is created between the DOE 115 and the interior portion of the second lens 701. The atmosphere in the defined volume may be controlled as desired vis a vis pressure or content. It will be appreciated that any other method of fabricating a compound lens effect is intended to be encompassed within the scope of the invention.

It will be understood that the techniques of the present invention provide an efficient way to provide an IR sensor array such as for example a 60×60 array. Such configurations are desirable for applications such as IR imaging where a sensor array of the present invention may be used to replace conventional IR arrays. Current IR arrays do not have the lens and sensor array integrated in a low cost unit as provided for by this invention. Current conventional IR arrays provide a vacuum package with an IR transparent window or lens in the package rather than the wafer level solution described by this invention.

Another application for the integrated senor element/lens cap configuration of the present invention is where depth of field analysis is required. By configuring the lens suitably, it is possible to focus light from two different distances onto separate sensor elements within the cap. This enables discrimination as to the origin of the heat source, for example is it a planar metal plate or a 3-Dimensional human torso. Such applications may include discriminatory deployment sensors for use in for example air bag deployment arrangements.

The dimensions of a sensor in accordance with the present invention are typically of the order of micro to millimetres. For example when targeting radiation of a wavelength of 10 micrometers, a cap may be dimensioned to have a collection area of about 1 mm$^2$ and be of a height of about 160 micrometers above the sensor element. These dimensions are however purely for illustrative purposes only and it is not intended to limit the present invention to any one set of dimension criteria.

The fabrication of the sensor of the present invention has been described with reference to an etch process. Typically this etch will be of the type of process known as deep reactive ion etching (RIE) which inherently produces substantially vertical sidewalls (approximately 90 degrees). One of the advantages of such a process is that with such verticality less space is required for the cavity sidewalls. This directly affects the size of the "window" and thus the overall size of the cap which can be made. By reducing the cap size there is a reduction in the area required on the chip—with a corresponding reduction in the "wasted" space under and around the cap edges.

Cap Arrangement Incorporating a Radiation Barrier.

Heretofore, a sensor in accordance with the teaching of the invention has been described with reference to a sensing device with a transparent window. The invention also provides in certain embodiments for the fabrication of a second cell also incorporating a sensing device, which provides a different response to that of the first cell. This second cell then may be considered a reference cell, which differs from the first sensing cell in that its response may be used in combination with the sensing cell to allow for a discrimination in the response of the sensing cell. One example of this is to make the reference cell totally opaque so its sensor sees only the cap (i.e. 300K) in the case of IR sensors, but one could make the reference partially opaque so there was always a known fraction of the ambient radiation getting through. There would be advantages to this in applications for gas sensors where the reference cell could be illuminated with radiation coming through the same optical path as the sensing side except for the gas to be sensed. This would remove spurious dependencies of the signal on e.g. water vapour. A further example would be where the optical characteristics of the second cell are the same as that of the first cell but it is selectively illuminated with radiation of a different frequency, i.e. a different source of radiation, so as to provide an output which is different to but which can be compared with that of the first cell. In all cases however it will be understood that the second cell is configured to provide a different response output to that of the first cell with the variance in response of this second reference cell may be provided by altering the characteristics of the cap used for the second cell being used to reference or calibrate the output of the first cell.

Figure 8:
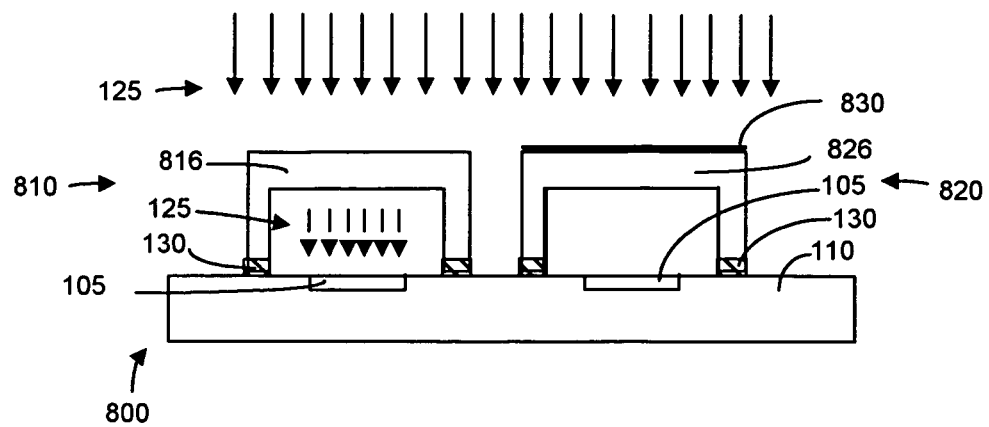
FIG. 8 shows a further embodiment where the sensor includes a reference element.

Typical embodiments will employ a reference cell with an optically opaque window. Such opacity may be used to provide a "dark" cell, one which will provide a signal output that is independent of the level of radiation being sensed by the first cell. FIG. 8 shows an example of such an arrangement. The same reference numerals will be used for components already described with reference to prior Figures.

In this arrangement a sensor device 800 includes a first cell 810 which provides an output indicative of the level of radiation incident on the sensor device and a second cell 820 which provides an output which is independent of the level of radiation incident on the sensor device. The first and second cells each include an IR sensor 105 formed on a first substrate 110 and each have a cap 816, 826 provided thereabove. The capping of each cell serves to define a controlled volume above each sensor, which as described above can be suitably evacuated or filled with a specific gas depending on the application. The second cell 820 differs from the first in that it is configured so as to prevent the transmission of radiation through the cap and onto the sensor 105. This may be achieved by providing an optically opaque layer 830 on the cell. The second cell can therefore be considered a reference cell, whose output is independent of the incident radiation. The output of this second cell can then be used to calibrate the output of the first cell, whose signal output will be determined by the intensity of the incident radiation thereon.

It will be understood that by providing such a reference cell, that a sensor device in accordance with the teaching of the invention enables a detection of radiation by providing for a comparison between outputs of an exposed sensor and those of a reference darkened sensor. In this device only the optical properties of the darkened sensor are changed, the thermal and electrical properties are the same as those of the illuminated sensor. In this way an accurate and precision sensing of incoming radiation is possible—be that IR radiation or any other type of electromagnetic radiation such as that in the visible spectrum.

Figure 9:
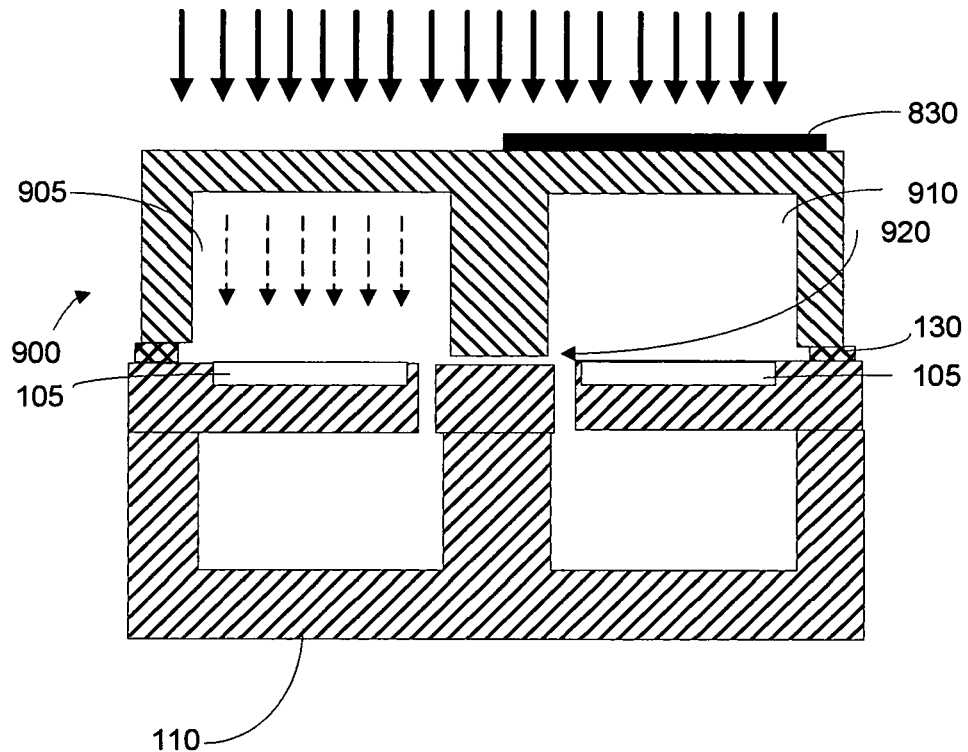
FIG. 9 shows a modification to the arrangement of FIG. 8.

The arrangement of the two cells shown in FIG. 8 is of two distinct cells, each being formed separately. Alternative arrangements such as that shown in FIG. 9, may provide a single cap 900 which is micro-machined to define two cavities or chambers 905, 910, one of which 905 is locatable over the illuminated element and the second 910 over the non-illuminated element. Each of the two defined areas has an IR sensitive element 105 and may be formed using any convenient process. The interior of the cap cavities may be filled with any desirable gas ambient (e.g. Air, Nitrogen, Argon, Xenon) or indeed simply provided as a vacuum. The cap is sealed to the substrate using a sealing process which can provide the necessary level of hermetic seal. Such techniques will be apparent to the person skilled in the art. The shield 830 which blocks the IR radiation is fabricated using (conveniently) a thin metal layer which will reflect incoming radiation. In order to avoid heating the cap non-uniformly, desirably the IR blocking layer should be a reflector, not an absorber. As shown in FIG. 9, a gap 920 in the sealing may be left between the individual lid chambers to allow the pressure in each chamber to equalise, independent of leak rate of the overall cap. Such an arrangement addresses the issue with many MEMS based IR sensor devices which are very sensitive to the ambient pressure.

In order to define the two chambers, a column 925 is provided. The column extends downwardly from the top 930 of the cap 900, and terminates at the gap 920 between the two chambers. The column may be coated with or doped to minimize the leakage of radiation between the two columns. Typical dimensions for the column are 50-100 microns wide and 170 microns high. The gap is typically of the order of 6 microns high which is of the order of the wavelength of the IR radiation being monitored so it is unlikely that any radiation could transfer through the gap from the illuminated cavity to the non-illuminated. However, if required further guarantees of the integrity of the dark cavity could be achieved by providing a step pattern—similar to a saw tooth arrangement—so as to allow the equalisation of pressure but occlude the transfer of radiation.

To further reduce the level of IR contamination within the un-illuminated cavity side, the walls of the separation region may also be coated with a reflecting metal (or other IR type barrier) to block IR which has been reflected from the illuminated surface. Alternatively this region may be treated (e.g. heavily doped to sufficient density using for example a polysilicon material or oxidized to sufficient thickness) in such a way as to absorb any reflected IR. The absorbing of the radiation is a preferred way to achieve the blocking of IR through the internal portions of the cavity as it ensures that it is taken out of the cavity as opposed to just bounced to another region—which would be the case in a reflective solution. The absorption provided by the side walls serves to damp down reflections to prevent the creation of spurious signals within each cell A further suitable technique could be to simply space the non-illumination sensor sufficiently from the illumination sensor so that the radiation will be absorbed naturally in the silicon.

It will be understood that a sensor arrangement in accordance with the teaching of the invention provides for the use of high thermal conductivity materials for the cap so as to ensure that the two sensing devices are exposed to the same temperature surface, thus again minimizing thermal contamination problems. While described with reference to silicon it will be understood that other materials such as germanium could also be used.

By using a capping arrangement such as that described herein it is possible to locate the illuminated and non-illuminated sensors adjacent to one another. As a result they can be fabricated at the same fabrication efficiency and the only difference between the two is the optical environment in which they operate. This is particularly useful for sensors that are used in high sensitivity applications where low differences in output between the two sensors (the reference and the active) are indicative of an actual measurement.

By providing at least two cells which differ in their response characteristics it is possible to define such active and reference cells as has been just described. The provision of the differing response characteristics can be implemented in any one of a number of different manners, for example by modifying the optical response characteristics, the electrical characteristics, the thermal response characteristics or even by keeping all these three characteristics the same and just illuminating each cell with a different source of irradiation.

Use of a Wheatstone Bridge Arrangement

While the specifics of the IR sensor (e.g. bolometer, thermopile or other) are relatively unimportant within the context of shielding, FIG. 9 shows an arrangement of the IR sensor in a Wheatstone bridge configuration. To function, one side of the Wheatstone bridge is required to be illuminated while the other side is in the dark. Using the structure of the cap arrangement previously described it is possible to shield the dark side of the bridge while maintaining otherwise identical thermal and electrical performance of the sensing elements. Such an integrated IR sensor structure combines a highly effective thermal management scheme, a vacuum or controlled ambient cap and a method of providing shielding for the dark side of the bridge. The cap structure ensures that the thermal and electrical properties of the shielded and illuminated bridge elements are identical. While described in FIG. 9 as a single device, it will be understood that such an arrangement can be applied to single sensors or arrays.

Figure 10:
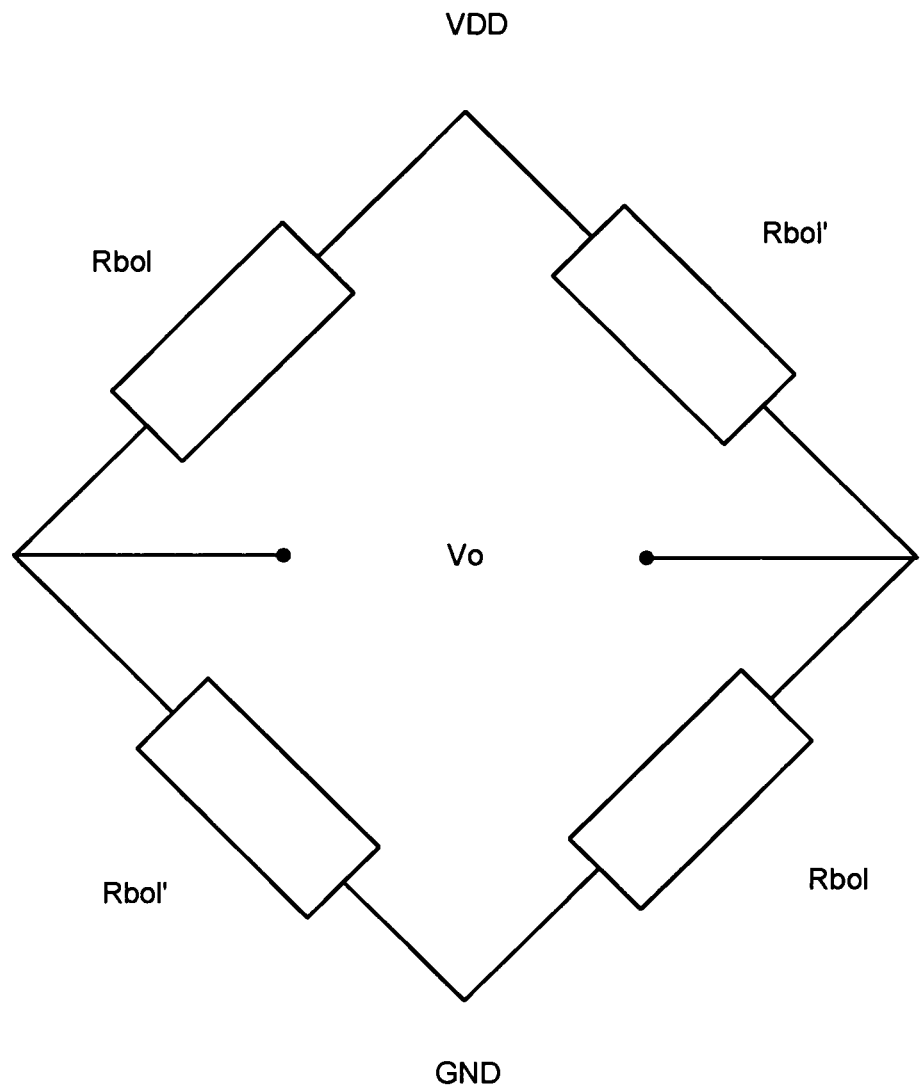
FIG. 10 shows an exemplary embodiment of a sensor configuration that may be used within the context of the present invention.

In a Wheatstone bridge configuration such as that shown in FIG. 10, a heat sensitive resistor (such as a thermistor or bolometer) on one side of the bridge (Rbol') is illuminated by the incoming radiation and the output of this side of the bridge is effectively compared to its un-illuminated pair (Rbol) to create an output voltage which is proportional to the difference in the resistance change between illuminated and unilluminated resistors:

$$Vo=VDD[(Rbol-Rbol')/(Rbol+Rbol')]$$

And for Rbol'=Rbol+$dR$ $$dVo \sim -2dR/4Rbol$$

The heat sensitive resistors are characterized by having a known temperature coefficient of resistance (TCR), and will absorb heat from the incoming radiation if they are illuminated. Thus it is clear that not alone must the resistors (Rbol) be maintained in the dark, they must also see the same thermal environment as Rbol' so that no other temperature effects are allowed to contaminate the observed signal. While other configurations of the bridge are possible and sometimes desirable, making the bridge from 4 identical resistors (same TCR, same thermal conductance and capacitance) in which 2 of the 4 are shielded from incoming radiation while otherwise maintaining the identical thermal environment for each of the illuminated resistors, gives optimum performance.

Using identical resistors has the effect that in the absence of any incoming radiation the output voltage will remain zero for any change in the background temperature of the resistors. The resistors which are not responsive to incoming radiation are often referred to as 'reference' bolometers.

While a radiation sensor using a Wheatstone bridge configuration using four physically separate resistors may provide suitable signal responses for certain applications, it is possible to improve the performance of the classic bridge configuration. An embodiment of the invention provides such an arrangement which improves the responsiveness of the sensor to an applied signal. In this arrangement each pair of the two resistors that form the opposing legs of the Wheatstone bridge are co-located on a thermally isolated table so as to ensure that they each are exposed to the same thermal environment.

Figures 11A, 11B:
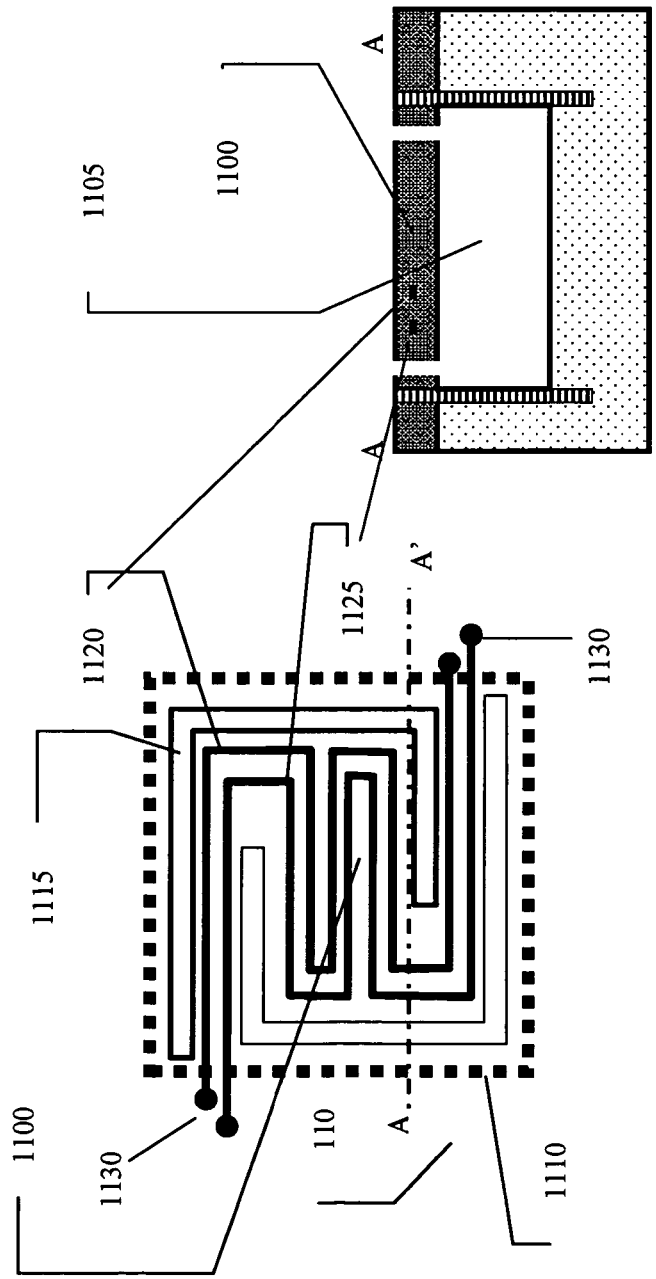
FIG. 11 shows in the context of a further embodiment the provision of sensor elements on a thermally insulated table.

As shown in the plan (FIG. 11a) and section (FIG. 11b) view of FIG. 11 (which shows the construction of a single table with two resistors) such an arrangement provides a thermally isolated table 1100 which is formed by etching a cavity 1105 in the silicon substrate 110. The extent of the cavity may be defined by the use of trenches 1110 which can control the extent of the etch process. The cavity serves to insulate the table 1100 from the substrate below. Slots 1115 can be provided to insulate the table from any thermal gradient in portions of the chip beside the table. First 1120 and second 1125 resistors are provided on the table, in this illustrated exemplary embodiment in a snake (S) configuration. It will be appreciated that the actual configuration of the resistors is not important, what is important is that the main portion of the fabricated resistor is provided on a thermally insulated table. Each of the two resistors are provided with contact points 1130, to facilitate connection of the resistors to the remaining portions of the bridge.

It will be understood that in this embodiment while FIG. 11 shows the formation of a table with two bridge resistors, i.e. one pairing of the Wheatstone bridge, that desirably each of the pairings of the bridge resistors are located on their own table. In this way the formation of the bridge configuration will require two thermally isolated tables, each of which are desirably formed using MEMS fabrication techniques. The two resistors on opposite legs of the Wheatstone bridge are co-located on the same table so as to ensure they both see the same temperature change and, if appropriately connected, provide twice the output signal for a given input radiation flux density.

The heat sensitive resistors are characterized by having a known temperature coefficient of resistance (TCR), and will absorb heat from the incoming radiation if they are illuminated by it (a suitable absorbing layer is included in the construction of the resistors and tables). A variety of absorbing layers may be used including layers of silicon nitride, silicon dioxide, silver compounds and resistive compounds such as Titanium nitride, such as are well known in this field. The challenge is to build the resistors in such a way that the absorbed energy creates a sufficiently large temperature rise and then to maximize the available output signal for the given temperature rise.

There are many well known advantages of a Wheatstone bridge configuration. A major benefit is that for a well matched set of resistors (e.g. all resistors having the same TCR and value) the output voltage is independent of the ambient temperature and only dependent on the total voltage across the bridge (VDD) and the localized heating of each illuminated resistor Rbol'. In this embodiment, the maximum possible signal is achieved by locating the two Rbol' units on one table and the two Rbol units on a similar table. Their construction ensures that the two tables are poorly coupled thermally while ensuring the radiation sensitive resistor pairs are isothermal. Although the thermal isolation of the table is slightly degraded as for high performance devices the thermal conductance of the table is dominated by the aspect ratio of the table legs. Thus, widening the legs to accommodate two resistors will cause a decrease in the achievable thermal resistance from the table to the substrate (the main heat sink in such systems). It will therefore be understood that as the legs affect the total DC response and the time constant of response of the sensor, that there is a certain trade-off possible where the designer of the system may choose different dimensions of legs depending on the speed of response versus accuracy required for the system.

While the above is described in terms of a Wheatstone bridge, it is not essential that such a configuration be used. For example if the sensing resistors were to be biased by an opposing pair of current sources the same structure could be used and would produce the same benefits. Other applications that would benefit from the provision of the thermally equivalent environment generated by the location of two resistive elements on the same thermally isolated table would include the scenario where a resistor was used in a feedback configuration with a second resistor providing a sensing element—both resistors combining to provide the response of the circuit and it being important that temperature variances between the two resistive elements did not introduce spurious results.

In FIG. 11 a table with 2 legs is shown but any number of legs can be used though generally there is a trade-off between mechanical stability and degree of thermal isolation of the table. A symmetric arrangement of legs is desirable for mechanical stability but is not essential.

As one side of the bridge is required to be illuminated by the incoming radiation and the other to be shielded from the radiation there will be separation between them, enough to allow the construction of a suitable shielding structure. Such a structure could be provided by the sensor arrangement of FIG. 9 where each of the pairings is provided on a thermally insulated table within a specific cavity. The IR sensors 105 can be provided as a resistor bridge arrangement by fabricating the bridge using silicon micromachining technology which is sensitive to infrared radiation. The micromachining of the two cavities 905, 910 can be effected with one of the cavities located over the illuminated element (Rbol') and the other over the unilluminated element (Rbol). As shown in FIG. 9, the unilluminated table may have a cavity 1105 underneath to give best resistor electrical and thermal matching to the illuminated side (if the incoming radiation is "sufficiently" blocked from reaching Rbol, or it may have no cavity underneath to provide a better thermal short circuit (thus minimising its IR response) to the substrate if the incoming radiation is only partially blocked.

While this embodiment has been described with reference to a preferred implementation where two resistive elements are provided on a thermally isolated table it will be understood that this illustration is exemplary of the type of benefit that may be achieved using the teaching of the invention. Such teaching may be considered as providing at least two thermally sensitive electrical elements on a first region which is thermally isolated from the remainder of the substrate. Such thermal isolation has been described with reference to the embodiment where the table is fabricated in the substrate, but it will be understood that equivalently a table could be fabricated on a substrate. Such a structure could be provided by for example, depositing a sacrificial layer on an upper surface of the substrate, then the sensor element layers, including support layers, and then removing the sacrificial layer, leaving a freestanding table. Alternative implementations where instead of the sacrificial layer, a deposited layer is provided having high thermal coefficients such that it serves to thermally isolate the formed sensor elements located thereabove from thermal effects present in the substrate. These and other modifications will be apparent to the person skilled in the art as a means to provide a thermal barrier under the electrical elements where high degrees of thermal isolation are required.

Thermal Barrier for Thermally Isolating Portions of the Die

As will be understood from the preceding, thermal sensors and other electrical elements can be effected by the temperature of the supporting substrate. It will be understood that thermal sensors specifically are sensitive by design to changes in temperature and often use the temperature of the supporting substrate as a reference or baseline temperature. However, if the sensor incorporates heat generating means (e.g. circuits) which are nearby then this reference or baseline temperature will be disturbed and will give rise to an error in the calculated temperature measured by the sensor.

Figures 12A, 12B:
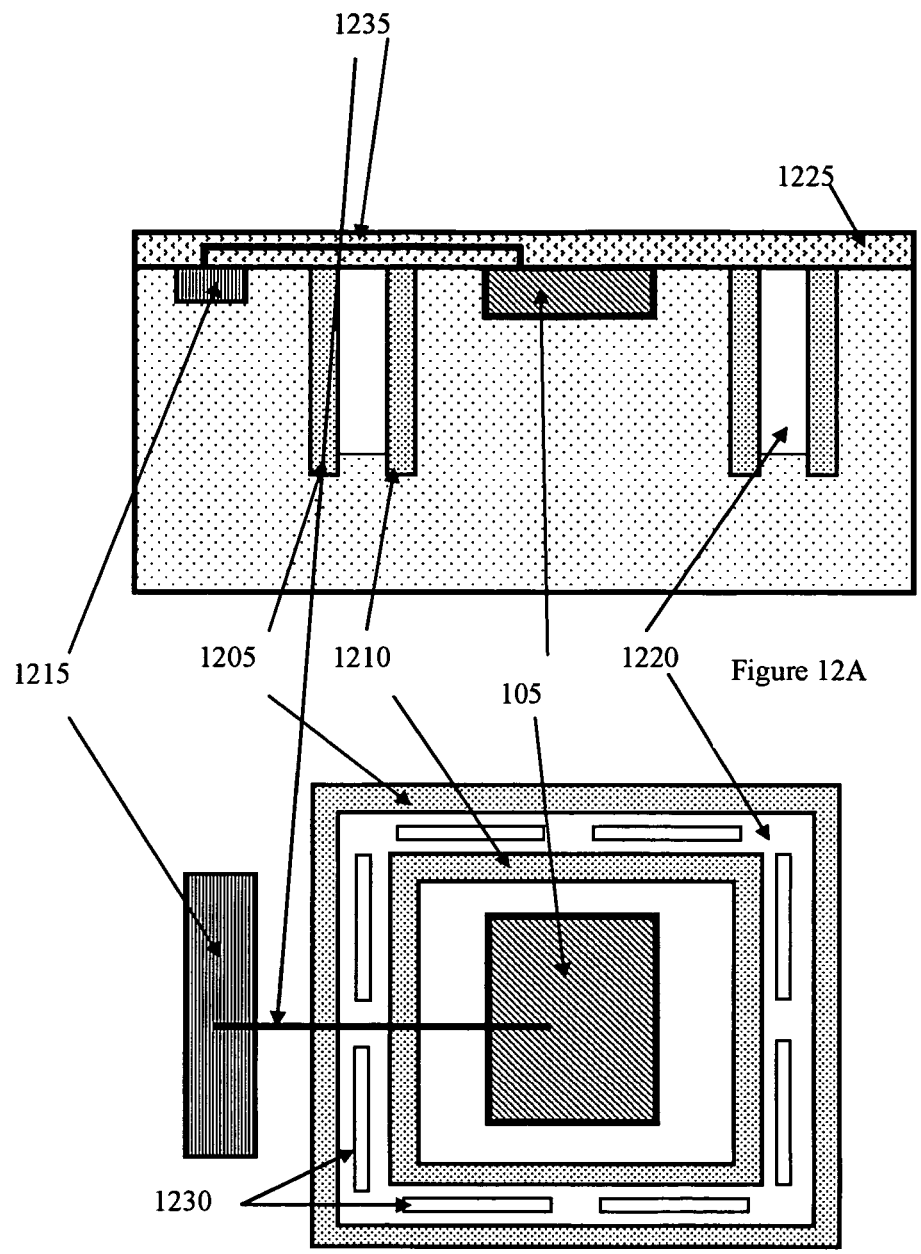
FIG. 12 shows in the context of a further embodiment the formation of a thermal barrier between a sensor and surrounding elements on the substrate, 12a being a section view and 12b a plan view of the arrangement.
FIG. 12c shows a modification to the arrangement of FIGS. 12a & 12b.

FIG. 12 shows another embodiment which illustrates a means of creating a thermal barrier between any heat generating region and the thermal sensor to isolate the sensor from any spurious source of heat. The degree of thermal isolation required can be engineered as needed. This embodiment uses pairs (or more, e.g. triples, etc.) of trenches spaced by gas or vacuum containing regions coupled possibly with silicon-on-insulator wafers to provide a high degree of thermal isolation.

While important for all such sensors and circuits the problem becomes particularly acute if the sensor is attempting to measure a thermal signal itself, e.g. an infrared sensor or a micro-calorimetry sensor, and therefore is particularly suited for incorporation in the sensor arrangements described with reference to FIGS. 1 to 11. Such sensors generally take the substrate temperature as a reference or baseline temperature and perform a comparison of their internal temperature with the substrate reference or baseline temperature. Any offset or unequal distribution in the baseline temperature, whether steady state or time varying can lead to inaccuracies in the sensor response in essentially direct proportion to the experienced offset.

Any nearby circuitry which is dissipating heat will cause a local temperature rise around the power dissipating element. This heat is conducted away from the element in a manner which is well controlled and understood according to the thermal conductivity properties of the materials used. While the thermal barrier may be suited for application with the capped sensors heretofore described, it will be now illustrated without reference to such capping.

This embodiment of the invention provides for a means for increasing the thermal resistance between a heat source and a sensor or sensitive circuit to reduce the impact of this extraneous heat source. With reference to FIG. 12, the main features of the structure and a method of making it are described. The same reference numerals will be used for parts previously described with reference to any one of FIGS. 1 to 11. A silicon or other suitable wafer is used as the substrate 110. The sensor is formed by any suitable method (the order of fabrication is not important) and then two adjacent deep trenches 1205, 1210 are etched in the substrate so as to form a ring around either the sensor 105 or the heat dissipating source 1215 and filled with an appropriate filling material 1205a, 1205b (e.g. silicon dioxide, silicon nitride, polysilicon or any combination of these). Each of the two trenches thereby form a first and second region having a first thermal coefficient and are separated from one another by an intermediary region 1220 which has a second thermal coefficient. This intermediary region may conveniently be provided by etching a region between the two trenches to form an air filled region which may be capped by means of an insulating cap 1225 to form an evacuated air filled region. Of course the available volume within this region 1220 could alternatively be filled with other gaseous compositions, as required. The remainder of the circuit elements are formed by any of the usual integrated circuit methods leaving the insulating cap 1225 over the trenches and the region between them. Occasional holes 1230 for etchant ingress are formed in this insulating layer exposing the silicon between the adjacent trenches. The entire wafer is then exposed to an etching medium, (e.g. XeF2 if a gas or KOH if a liquid etchant), chosen so as to etch only the silicon, which removes the silicon between the trenches. The low thermal conductivity of this gas filled space ensures that little heat is transferred from source to sensitive element down to the depth of the trenches and removed zone. The heat is forced to flow under the trenched and etched area thus increasing the effective thermal resistance between the heat source and the sensitive element.

Figure 12C:
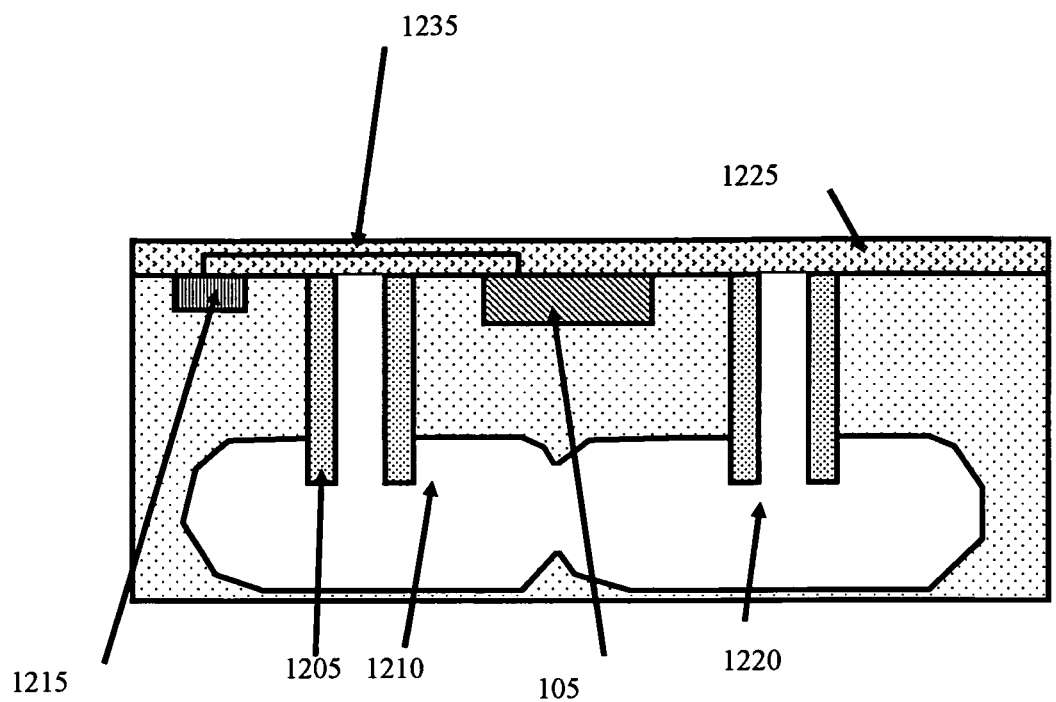
Figure 13:
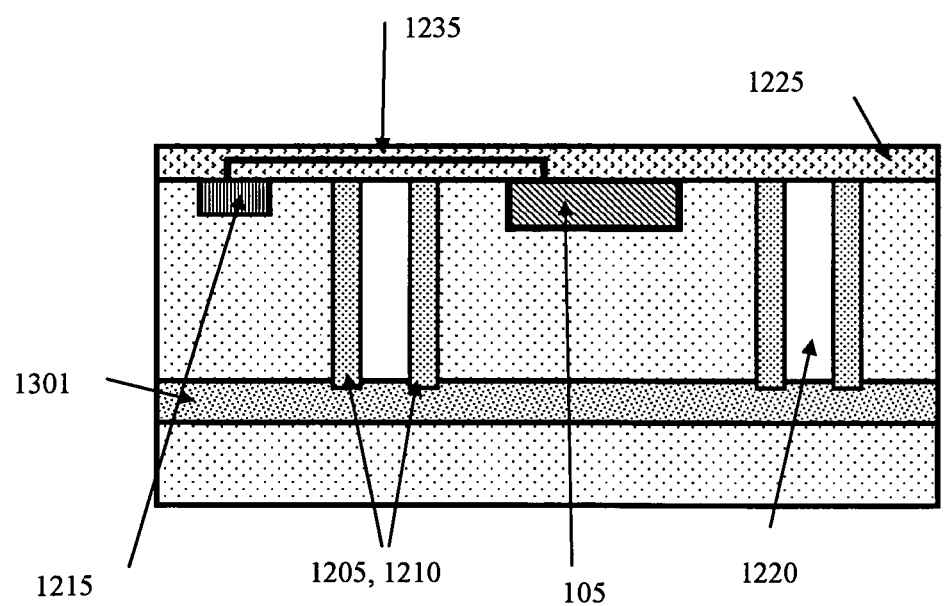
FIG. 13 shows a further modification to the arrangement of FIG. 12.

Increased levels of thermal isolation can be obtained in a number of different manners such as by (1) using multiple such thermal barriers, (2) increasing the depth of the trenches and removed zone relative to the overall depth of the silicon substrate, (3) as shown in FIG. 12c, by extending the etch sufficiently that an undercutting 1240 under the sensor element is defined so creating to a greater or lesser extent an enclosed isolated "island" 1250 or (4) by using a substrate of silicon-on-insulator material 1301 and ensuring that the trenches are etched to the depth of the buried insulator layer as shown in FIG. 13. The person skilled in the art will be familiar in the fabrication of structures incorporating such buried oxide layers. As the oxide or other dielectric layers have much lower thermal conductivity than semiconductor or metallic layers, the use of such materials may additionally improve the thermal isolation achieved. The extent of the etch shown in FIG. 12c can be controlled by having one of the trenches formed deeper than the other, typically the outer trench, so that the etch is achieved preferentially in a direction under the sensor. The provision of this evacuated region under the sensor creates a region of different thermal characteristics to that of the surrounding silicon substrate and thereby provides increased thermal insulation for the sensor located above.

Advantageously the trenches could be filled with a dielectric such as silicon dioxide provided using any known method. However, because of the difference in coefficients of thermal expansion between silicon dioxide and silicon it has been more common to use a thin layer (e.g. 100-200 nm) of silicon dioxide or silicon nitride or both to line the etched trenches and then fill the bulk of the trench with polysilicon. This significantly decreases the effectiveness of the trench as a thermal barrier due to the high thermal conductivity of polycrystalline silicon. In principle the trenches could be left unfilled after the silicon dioxide layer is deposited but this gives rise to problems of surface potential control at the trench/silicon substrate interface which is generally undesirable if the trench has any function other than thermal isolation. Also, as it is desired to ensure cost is kept to a minimum, our approach uses steps which are in many situations used for the fabrication of the sensor itself and thus add no further cost to the fabrication process. Due to the surface potential control problem mentioned above, this would probably not be acceptable in the case for an unfilled trench (i.e. a trench used in the process for electrical isolation could not tolerate such a surface potential control issue). It is also frequently desired to perform the trench processing at the beginning of the fabrication sequence for the whole process and an unfilled trench could not be tolerated in this case as it would fill with process residues leading to unmanageable defect levels due to its open top. The method we suggest is intended to be carried out at the end of the process sequence, using trenches which have been fabricated at any point in the process, thus avoiding any such issues.

The formation of a thermal barrier, by defining regions of different thermal coefficients, around the temperature sensitive element serves to isolate the element from the effects of any heating from adjacent components. It will be appreciated that it may still be necessary to electrically couple components within the thermal barrier region to those outside the region. Such coupling may be achieved by providing any one of a number of different types of electrical connection, such as a wire track 1235, between the components that need to be coupled. Depending on the circumstances of application of such sensors different degrees of thermal isolation may be required which will affect the ultimate thermal barrier configuration chosen.

Distributed die Temperature Sensor

While the sensors heretofore described have been described with reference to stand-alone sensors or arrays of such sensors, in another embodiment of the invention an arrangement which provides for die temperature sensing is also provided. Such an arrangement is shown in FIGS. 14 to 17.

The provision of such die sensing provides a means of measuring the die temperature at a number of locations around the die, these temperature measurements can then be used to re-compensate the apparent observed temperature. This may be done by locating small temperature measurement means, such as sense diodes and/or transistors at strategic points around the die and using temperature sensor circuits to measure these spot temperatures, providing the data to the user. Where used in combination with the thermal barrier that was illustrated above with reference to FIGS. 12 & 13, the efficacy of the thermal barrier can also be checked in production by applying a known heat source and measuring the change in temperature across the barrier, dT, using sensors located on either side of the thermal barrier.

It is known that any circuitry which is dissipating heat will cause a local temperature rise around a power dissipating element. This heat is conducted away from the element in a manner which is well controlled and understood according to the thermal conductivity properties of the materials used. In addition, other die temperature changes at local or wider levels can be caused by external sources of radiation or ambient temperature changes. For example, if an IR thermal sensor is measuring a scene which includes a moving hot-cold edge (e.g. a hot object on a conveyor), a die temperature change will occur on the sensor die, moving from one edge to the other as the object transits the field of view. Likewise, if the same thermal sensor is carried from a cold environment to a hot one, the base die temperature will change with some appreciable time lag causing reading inaccuracies. Thus, both global die temperature changes and fixed or time varying temperature gradients can cause severe measurement inaccuracies.

Another problem that occurs for MEMS implementations of the thermal sensor, where a thermal barrier has been etched into the silicon substrate, is that the thermal barrier may be breached or incompletely formed, either at the silicon processing stage or during the capping process that was described with reference to previous figures. Some means of checking this barrier at probe and final test is useful to eliminate poorly performing die.

The problem can be significantly better managed if a number of temperature sensors are located around the die area and the localised temperature readings are then used to compensate the IR thermal sensor measurements. The application is particularly important for thermal sensor arrays used for radiometric applications (i.e. where actual temperature measurement is needed as opposed to thermal imaging), where die temperature gradients can cause severe temperature measurement inaccuracies.

Figure 14:
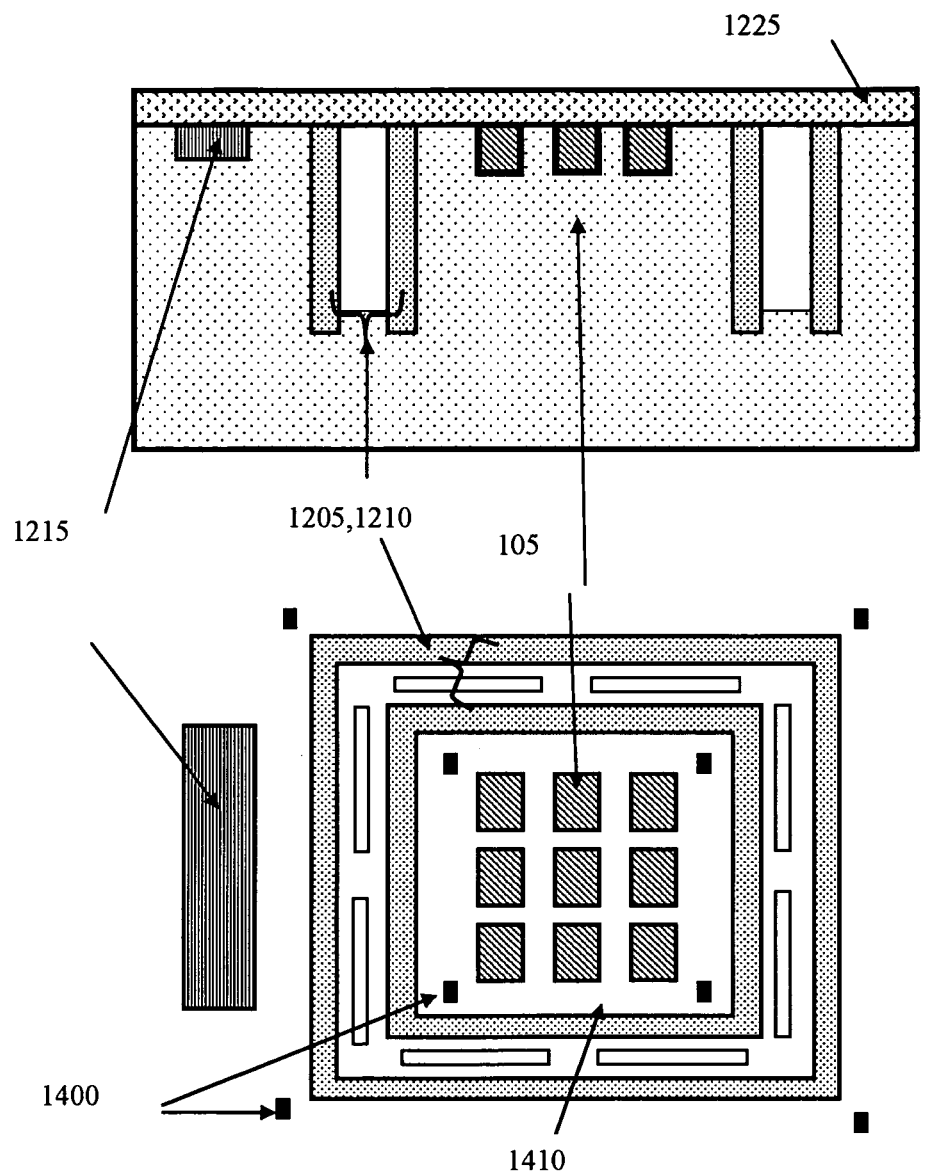
FIG. 14 shows in the context of a further embodiment the provision of die temperature sensors.

In this embodiment of the invention, we disclose within a system such as a thermal infrared or microcalorimetric sensor or imaging system, a distributed set of temperature sensing points located within and without the thermal barrier (i.e. on either side of a thermal barrier), if that exists. These temperature sensing points can be made in many ways but advantageously they are made using PN junctions which are then driven with circuits well known to those skilled in the art. FIG. 14 shows how such an arrangement might look. The same reference numerals are used for components described with reference to previous drawings.

As shown in FIG. 14 a plurality of individual die temperature sensors 1400 are provided, and are arranged about the die. In the views of FIG. 14, a plurality of individual IR sensors 105, similar to those described previously, are provided within a thermal barrier region 1410 defined by trenches 1205, 1210. Die temperature sensors 1400 are provided within this thermal barrier region to monitor the die temperature within the region. Additional die temperature sensors are provided outside the thermal barrier region 1410. To check the thermal barrier integrity formed by the trench arrangement, these temperature sensing devices 1400 are combined with sources of known heat load such as resistors 1215. In some embodiments the heat load function can be combined with a known TCR resistor in a single unit thus combining the functions of heating and temperature sensing to minimise space use. Alternatively, the heater could also simply be a known source of heating on the die e.g. a nearby high current region such as the input stage of an amplifier. The array temperature sensors could also be used to perform the same function, i.e. for a known circuit condition where a source of heat is available external to the thermal isolation barrier, the internal array of sensors will show a specific pattern of temperature measurements. Any deviation from this once characterised, will point out a thermal barrier defect.

When a known heat load is applied through the resistor(s) temperatures can be measured on either side of the barrier to ensure its integrity. These temperature differences would be characteristic of any given system and the package it is located within. Any defect or fault in the barrier (e.g. bridging of the thermal isolation trench by some extraneous material) would result in a temperature difference smaller than expected.

To assist in improving the accuracy of the thermal sensor measurement, the die temperature measurement devices 1400 need to be distributed around the die within the thermal barrier so that local, time varying temperature measurements of the die next to individual sensor pixels and gradients across the die can be known. The user can then select to make either average die temperature measurements (average all readings) during the course of a measurement or in applications which experience sharp thermal scene temperature differences (either spatially or temporally) the local temperature reading can be used to improve the temperature measurement accuracy of any individual pixel.

Figure 15:
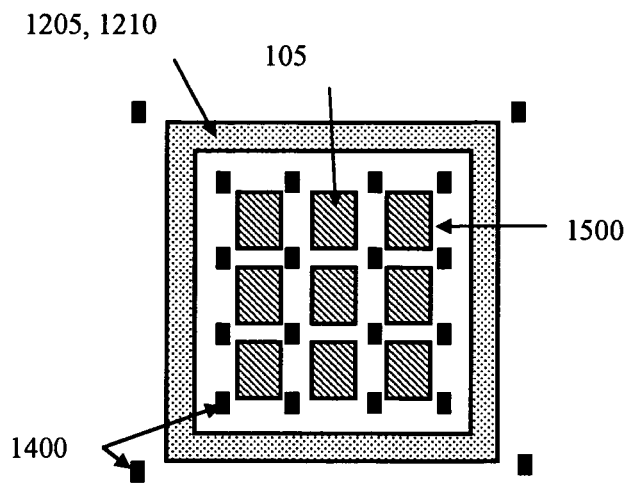
FIG. 15 shows an example of an array of the die temperature sensors of FIG. 14.
Figure 16:
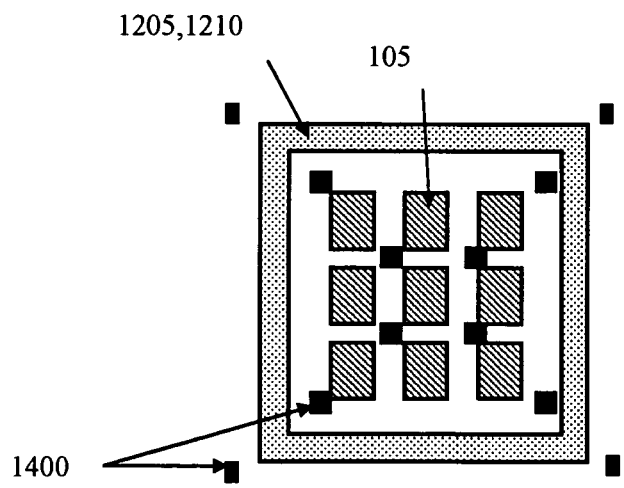
FIG. 16 shows a further example of an array of the die temperature sensors.
Figure 17:
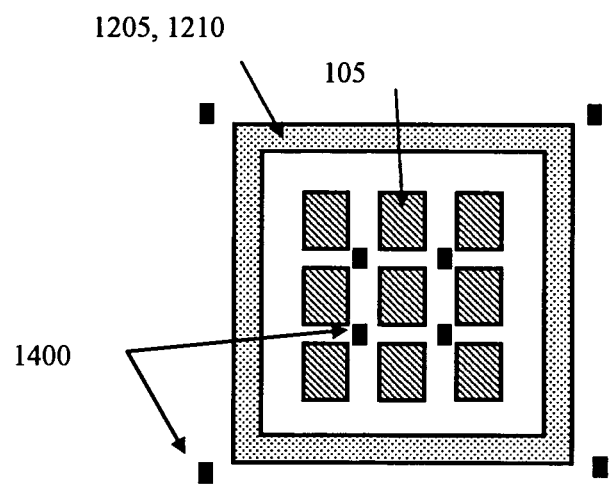
FIG. 17 shows a further example of an array of the die temperature sensors.

FIGS. 15 to 17 show a distributed temperature sensor for a small array. A variety of temperature sensor placing strategies can be used. As shown in FIG. 15, temperature sensors 1400 may be placed at all corners of the small 3×3 pixel array 1500. This gives detailed knowledge of the die temperature "map" but is costly in terms of area used and wiring required to connect all the sensors. FIG. 16 shows an alternative where, for this size array, all outside corners and all 4 interior corners host temperature sensors 1400. This gives 2 sensors for each pixel and 4 for the centre pixel, which could be advantageous in some applications where greatest accuracy is required of a specific pixel in the array. FIG. 17 shows a minimal coverage situation where only the 4 interior corners host temperature sensors. In this situation there is at least one temperature sensor per pixel, some have two and the centre pixel again has 4 sensors. This distribution may be less effective in the detection of thermal barrier defects (depending on the size of the array and/or area inside the thermal barrier) as the sensors are located further from the barriers. It will be understood from the different examples of FIGS. 15 to 17 that different applications will require other distributions of die temperature sensors. Furthermore it will be understood that the distribution of the individual die temperature sensors may require some of the die temperature sensors to be located under the caps of the sensor with others located outside the caps.

It will be understood that an arrangement such as that provided by the present invention offers many advantages over the existing state of the art. Current practice in thermal radiometric measurement systems is to measure the die temperature with an external temperature sensor located in close thermal contact or proximity with the sensor package. This ambient temperature measurement unit is usually mounted on the same PCB or may be mounted in physical contact with the radiometric sensor or array. Some sensors and arrays will have a sensor located physically on the same die but never an array of die temperature sensors has been used. If, the die temperature sensors are made using known circuit techniques for building active temperature sensors then the user will have access to pre-calibrated die temperature information in great detail, not requiring him to undertake extensive calibration of this parameter.

Sensing the die temperature with an additional sensor located outside the package gives rise to an apparent thermal lag between actual array temperature and ambient or PCB temperature. This leads to unacceptably long periods of inaccurate readings for many applications. The scheme disclosed here provides far superior measurement of the die temperature without this thermal lag.

It will be understood that the sensors described herein have been illustrated with reference to exemplary embodiments. It will be understood that the features of any one embodiment may be used with those of another embodiment or indeed can be applied independently of the structural features of the other embodiment. Applications for such sensors can be in a plurality of environments such as IR to Digital converters, both single pixel and arrays. Further applications include single point thermal measurement systems, e.g., digital thermometers, intruder alarms, people counting sensors, and into infra-red cameras to thermally image scenes. These and other applications will be readily apparent to the person skilled in the art on review of the teaching set forth herebefore. Therefore while the invention has been described with reference to preferred embodiments it will be understood that it is not intended that the invention be limited in any fashion except as may be deemed necessary in the light of the appended claims.

The words upper, lower, inner and outer are used for ease of explanation so as to illustrate an exemplary illustrative embodiment and it in not intended to limit the invention to any one orientation. Similarly, the words comprises/comprising when used in this specification are to specify the presence of stated features, integers, steps or components but does not preclude the presence or addition of one or more other features, integers, steps, components or groups thereof.

Furthermore although the invention has been described with reference to specific examples it is not intended to limit the invention in any way except as may be deemed necessary in the light of the appended claims, and many modifications and variations to that described may be made without departing from the spirit and scope of the invention.

The invention claimed is:

1. An electromagnetic radiation sensor comprising:
a first sensor element and a second sensor element formed in a first substrate, and
a first cap and a second cap formed in a second substrate, the first and second substrates being arranged relative to each other such that the first cap overlies the first sensor element, and the second cap overlies the second sensor element, thereby defining first and second cells, respectively, wherein the first cell provides an output based on a first response characteristic and the second cell provides an output based on a second response characteristic,
wherein the first cap is configured to pass a first amount of an ambient radiation through the first cap,
wherein the second cap is configured to pass a second amount of the ambient radiation through the second cap,
wherein the second amount of the ambient radiation is a known fraction of the first amount of ambient radiation, and
wherein the second amount is less than the first amount, and is greater than zero.

2. The sensor as claimed in claim 1 wherein the response characteristics of each of the first and second cells are a function of at least one of the following properties of each cell:
a) the optical response characteristic,
b) the electrical response characteristic,
c) the thermal response characteristic,
d) the nature of the radiation source used to illuminate each of the first and second cells.

3. The sensor of claim 1 wherein the cap for the first sensor element includes an optical element configured to provide a focusing of the incident radiation onto the first sensor element.

4. The sensor as claimed in claim 1 wherein the arrangement of the first and second substrates relative to one another define a cavity between each of the caps and their respective sensor elements.

5. The sensor as claimed in claim 1 wherein the first and second sensor elements are infra-red sensor elements.

6. The sensor as claimed in claim 4, wherein the cavities are provided at a pressure lower than ambient pressure.

7. The sensor as claimed in claim 4, wherein the cavities are populated with a gaseous composition selected for the application with which the sensor is to be used.

8. The sensor as claimed in claim 1 wherein the caps for the first and second element are formed in the same second substrate, the sensor additionally comprising an outer cap, the outer cap being orientated over the second substrate, the outer cap including an optical element.

9. The sensor as claimed in claim 1 wherein each of the first and second substrates is arranged relative to one another such that each of the caps are formed by side walls extending upwardly from the first substrate and supporting a roof therebetween, the roof being in a plane substantially parallel to the sensor elements.

10. The sensor as claimed in claim 9 wherein each of the first and second sensor elements are adjacent to one another, the caps provided thereabove sharing a common central column that extends downwardly from the roof, thereby defining chambers for each of the first and second sensor elements.

11. The sensor as claimed in claim 10 wherein the central column does not extend fully from the roof to the first substrate, such that a gap is defined between a lower surface of the column and an upper surface of the first substrate.

12. The sensor as claimed in claim 1 wherein each of the first and second sensor elements is provided as a bolometer.

13. The sensor as claimed in claim 1 wherein at least a portion of one of the first and second sensor elements are suspended over a cavity defined in the first substrate, the cavity providing thermal insulation between the first substrate and the sensor element.

14. The sensor as claimed in claim 1 wherein the first and second sensor elements are arranged in a Wheatstone bridge configuration.

15. The sensor as claimed in claim 1, wherein the trench arrangement is located around the one or more of the sensor elements so as to define a thermal barrier around the one or more of the sensor elements.

16. The sensor as claimed in claim 1, wherein the trench arrangement is located between the one or more of the sensor elements and a heat source provided on the first substrate.

17. The sensor as claimed in claim 1 further including a plurality of die temperature sensors, the plurality of the die temperature sensors providing an output indicative of the temperature of the die on which the sensor is located.

18. A sensor array including a plurality of sensors, each of the sensors having an active sensor element and a reference sensor element, the active sensor element being formed in a first substrate and having an optical element formed in a second substrate, the first and second substrates being configured relative to one another such that the second substrate forms a first cap over the sensor element, the optical element being configured to guide incident ambient radiation through the first cap to the sensing element, the reference sensor element also being formed in the first substrate and having a second cap formed in the second substrate, the first and second substrates being configured relative to one another such that the second cap is located over the reference sensor element, the second cap serving to pass a modified intensity of the incident ambient radiation therethrough to the reference sensor element relative to the intensity of the incident ambient radiation passing through the first cap such that the active and reference sensors have a different response characteristic, wherein the modified intensity is a known fraction of an intensity of the incident ambient radiation,
wherein the modified intensity is less than the intensity of the incident ambient radiation, and is greater than zero.

19. The sensor array of claim 18 wherein an output of the sensor array defines an image plane.

20. An electromagnetic radiation sensor fabricated in a semiconductor process, the sensor comprising:
first and second sensing elements formed in a first substrate, the first and second sensing elements being provided with first and second caps, respectively, defined thereabove, the first and second caps being formed in a second substrate and being mountable onto the first substrate,
wherein the first cap formed over the first sensing element allows a transmission of an ambient radiation through the first cap onto the first sensing element, and
wherein the second cap formed over the second sensing element partially blocks the transmission of the ambient radiation through the second cap onto the second sensing element so as to pass a reduced intensity of the ambient radiation therethrough onto the second sensing element relative to the intensity of the ambient radiation transmitted through the first cap onto the first sensing element, wherein the reduced intensity is a known fraction of an intensity of the ambient radiation,
wherein the reduced intensity of the ambient radiation is greater than zero.

21. The electromagnetic radiation sensor of claim 20, wherein the first cap defines a first controlled volume above the first sensing element, and wherein the second cap defines a second controlled volume above the second sensing element.

22. The electromagnetic radiation sensor of claim 21, wherein the first controlled volume is separate from the second controlled volume.

* * * * *